United States Patent
Pavicic

(10) Patent No.: US 6,816,102 B2
(45) Date of Patent: Nov. 9, 2004

(54) SYSTEM FOR DIGITIZING TRANSIENT SIGNALS

(75) Inventor: Mark J. Pavicic, Fargo, ND (US)

(73) Assignee: Dakota Technologies, Inc., Fargo, ND (US)

( * ) Notice: Subject to any disclaimer, the term of this patent is extended or adjusted under 35 U.S.C. 154(b) by 0 days.

(21) Appl. No.: 10/600,319

(22) Filed: Jun. 20, 2003

(65) Prior Publication Data

US 2004/0051656 A1 Mar. 18, 2004

Related U.S. Application Data

(60) Provisional application No. 60/390,789, filed on Jun. 20, 2002.

(51) Int. Cl.[7] ................................................ H03M 1/12
(52) U.S. Cl. ...................... 341/155; 341/122; 341/166
(58) Field of Search .............................. 341/155, 166, 341/122, 165

(56) References Cited

U.S. PATENT DOCUMENTS

| | | | |
|---|---|---|---|
| 2,600,193 A | 6/1952 | Bell, Jr. et al. ............. | 342/160 |
| 3,898,656 A | 8/1975 | Jensen ......................... | 342/106 |
| 4,271,488 A | 6/1981 | Saxe ........................... | 365/240 |
| 4,353,057 A | * 10/1982 | Bernet et al. ................ | 341/136 |
| 4,364,029 A | * 12/1982 | Villa .......................... | 315/8.51 |
| 4,811,285 A | 3/1989 | Walker et al. ................ | 365/45 |
| 4,833,445 A | 5/1989 | Buchele ....................... | 341/118 |
| 4,922,452 A | 5/1990 | Larsen et al. ................ | 365/45 |
| 5,144,525 A | 9/1992 | Saxe et al. ................... | 365/45 |
| 5,257,025 A | 10/1993 | LeCroy, Jr. ................... | 341/100 |
| 5,406,507 A | 4/1995 | Knierim et al. ............... | 365/45 |
| 5,416,480 A | * 5/1995 | Roach et al. ................. | 341/61 |
| 5,519,342 A | * 5/1996 | McEwan ....................... | 327/94 |
| 5,537,113 A | 7/1996 | Kawabata .................... | 341/141 |
| 5,796,361 A | 8/1998 | Levinson ..................... | 341/172 |
| 5,969,654 A | * 10/1999 | Goldin ........................ | 341/141 |
| 6,091,619 A | 7/2000 | Kogan .......................... | 365/45 |
| 6,097,232 A | 8/2000 | McKinney .................... | 327/270 |
| 6,255,962 B1 | * 7/2001 | Tanenhaus et al. ..... | 340/870.05 |
| 6,452,373 B2 | * 9/2002 | Medelius et al. ............. | 324/72 |

OTHER PUBLICATIONS

R. Ball & D. Nitz, "A First Look at Switched Capacitor Array Technology", May 1996; pp. 1–11.

M. Feuerstack–Raible, "Overview of microscopic read–out chips", Dec. 1999; pp. 1–14.

F. Anghinolfi et al., "The ADAM Chip—Specification and Measurement Results", ATLAS Internal Note, INDET–113, Oct. 1995; pp. 1–6.

S.R. Klein et al., "Front End Electronics for the STAR TPC", STAR Note #239, pp. 1–8. (Also published in IEEE Trans on Nuclear Science, v43, 1768 (1996)).

(List continued on next page.)

*Primary Examiner*—Peguy JeanPierre
(74) *Attorney, Agent, or Firm*—Dorsey & Whitney LLP

(57) ABSTRACT

An apparatus for capturing and digitizing at least one analog signal derived from an event with a signal duration that is short compared to the interval between consecutive analog signals has two or more memories each capable of storing a sequence of analog samples of one of two or more analog signals derived from the event. There is a trigger for triggering the sampling and storage in the two or more memories of a sequence of analog samples to occur at about a 0.5 gigahertz or higher rate and circuitry communicating with the memories for selectively initiating the read out of the analog samples in the memories. An analog to digital converter receives each analog sample read out from each of memories and produces from the analog samples corresponding digitized sample values. A digital signal processor controls parameters of the analog to digital converter and outputs the digitized sample values, such that the receiving and conversion and the output of digitized sample values is completed during the interval between consecutive analog signals.

32 Claims, 6 Drawing Sheets

OTHER PUBLICATIONS

M.S. Emery et al., "A Multi–Channel ADC for Use in the PHENIX Detector", IEEE Trans Nucl Sci, vol. 44, No. 3, Jun. 1997; pp. 374–378.

M.S. Emery et al., "Timing and Control Requirements for a 32–Channel AMU–ADC ASIC for the PHENIX Detector", IEEE N5597 Nuc Sci Sym, New Mexico, Nov. 1997, p. 1–6.

F. Anghinolfi et al., "AROW—A 128 Channel Analogue Pipeline with Wilkenson ADC and Sparsification ASIC", The ATLAS Collaboration, 1995, p. 1–5.

T. Zimmerman et al., "SVX3: A deadtimeless readout chip for silicon strip detectors", Nuc Inst Meth, A409, 368 (1998), p. 1–5.

S. Nahn, "Status of CDF Tracking", slide with title "SVX3D ASIC", presentation at ICHEP, Jul. 2002, 1 page.

"SVX4 Chip Specifications", May 2001; pp. 1–4.

L. Christofek et al., "SVX4 User's Manual", Version 7, May 2003; pp. 1–20.

G.M. Haller, "High–Speed, High–Resolution Analog Waveform Sampling in VLSI Technology", Ph.D. Dissertation, Technical Report No. ICL94–030, Sanford University, Mar. 1994; pp. 83–88.

G.M. Haller & B.A. Wooley, "A 700–MHz Switched–Capacitor Analog Waveform Sampling Circuit", IEEE J Solid–State Circuits, vol. 29, No. 4, Apr. 1994; pp. 500–508.

D. Lachartre & F. Feinstein, "Application Specific Integrated Circuits For ANTARES Offshore Front–end Electronics", $2^{nd}$ Int'l. Conf. on New Developments in Photodetection, Beaune, France, 1999, p 1–5.

F. Feinstein, "The ANTARES digital electronics scheme", Intl Cosmic Ray Conf, 1999. p. 1–4.

F. Druillole et al., "The Analogue Ring Sampler: An ASIC for the Front–End Electronics of the ANTARES Neutrino Telescope", IEEE Nuc Sci Sym, Nov. 2001, p. 1–18.

"Conceptual Design Report of the 0.1 $km^2$ Detector", ANTARES Internal Doc, Dec. 1999; pp. 27–28, 42–43.

J.P. Denance, P. Nayman, F. Toussenel, & M. Punch, "Proposal for the HESS experiment electronics", LPNHE–Paris, HESS Electronics, Feb. 1999; pp. 1–6.

C. Bronnimann, R. Horisberger, & R. Schnyder, "The domino sampling chip: a 1.2 GHz waveform sampling CMOS chip", Nuc Inst & Meth in Phy Res, A420, 1999; pp. 264–269.

S.A. Kleinfelder, "A Multi–Gigahertz Analog Transient Recorder Integrated Circuit", MS Thesis, UC–Berkeley, 1992; pp. 8–13.

S.A. Kleinfelder, "A Multi–GHz, Multi–Channel Transient Waveform Digitization Integrated Circuit", 2002, p 1–6.

G.T. Przybylski, "Analog Transient Waveform Digitizer R1.1 (V2)", LBNL, 2001. (http://rust.lbl.gov/~gtp/ATWD/atwd_manual3.doc). one page.

J. Jacobson et al., "Technical Requirements, Engineering Solutions and R&D/Production Planning for the LBL Digital Optical Module", DOM Tech Design Report—LBNL, Dec. 1998, p 1–3.

D. Nygren, W. Greiman, D.M. Lowder, G. Przybylski, & R. Stokstad, "Digital Optical Module & System Design for a Km–Scale Neutrino Detector in Ice", LBNL–42013, Mar. 1998; pp. 1–25.

Datasheet for Maxim MAX108 8–bit 1.5 GS/s ADC, Sep. 1999. one page.

Datasheet for ATMEL TS83102G0B 10–bit GS/s ADC, Jun. 2003, pp. 1–2.

W.O. LeCray, Jr., "Current–Sampling Waveform Acquisition For Digital Oscilloscope And Detector Applications", $5^{th}$ Int Conf on Calorimetry in High–Energy Physics, New York, 1994; pp. 436–441.

Y. Arai et al., "Development of Front–End Electronics for the Telescope Array Project", Int Cosmic Ray Conf, Aug. 1999, p. 1–4.

"TMS320F28x DSP Analog–to–Digital Converter (ADC) Reference Guide", Texas Instruments, SPRU–060A, Aug. 2003; pp. 1–1 –1–4.

P. Barale, "STAR SCA/ADC Datasheet." Sep. 1994.

Datasheet for Acquiris waveform digitizer model D210, 500 MHz 2GS/s; Jun. 1999; pp. 1–8.

Datasheet for LeCroy PXD222 PXI Digitizers, Jul. 2001.

Advertisement for GaGe CompuScope 85GC, Feb. 1, 2002.

O. B. Milgrome, S.A. Kleinfelder, "A Monolithic CMOS 16 Channel, 12 Bit, 10 Microsecond Analog to Digital Converter Integrated Circuit", IEEE Trans Nuc Sci, vol. 20, No. 4, Aug. 1993; pp. 721–723.

S. A. Kleinfelder, "A 4096 Cell Switched Capacitor Analog Waveform Storage Integrated Circuit", IEEE Trans Nucl Sci, vol. 37, No. 3, Jun. 1990; pps. 1230–1236.

* cited by examiner

US 6,816,102 B2

SYSTEM FOR DIGITIZING TRANSIENT SIGNALS

PRIORITY

The present application claims the priority of U.S. provisional patent application No. 60/390,789 filed Jun. 20, 2002.

FIELD OF THE INVENTION

The present invention relates to signal sampling systems and more particularly to signal processing methods and architecture for capturing and digitizing transient signals where a high frequency rate of sampling is needed, but the events leading to the signal samples occur at a significantly lower frequency than the sampling frequency.

BACKGROUND OF THE INVENTION

In a variety of fields it is useful to sample signals at a high rate in order to determine the time variations in intensity, phase or other features that occur in a waveform over time. One example of this sampling is the use of fluorometers, where precise fluorescence intensity data may be gathered as part of a variety of detection tasks. In particular, it is desirable to record the time rates of decay of the fluorescence produced by one or more fluorophores as a result of illumination by a short pulse of light. Another example is in observing transmission phenomena, where changes between a transient input signal applied to a system and the corresponding transient output signal are of interest. A further example is radar and similar systems in which a signal is emitted and it is of interest to capture the signal resulting from a reflection. If the sampled signals are digitized, it greatly facilitates analysis of the resulting data.

There exist systems that perform continuous digitizing of sampled analog data. If the sampling rate must be high, then because all the components involved in sampling and analog to digital (A to D) conversion must operate at the same high rate to avoid massive analog memory requirements, the systems are very expensive. In some circumstances the high sampling rate needs to occur only during a short sampling window corresponding to a transient event. This provides an opportunity to sample at a high rate and perform digitizing at a slower rate. This limits memory and may permit cheaper components to be used for slower functions. Such systems are known as Fast-in Slow-out (FISO) systems, e.g., U.S. Pat. Nos. 4,833,445 and 6,091,019.

With most FISO systems challenges remain. When sampling data from an event occurs at near gigahertz (or higher) rates, large amounts of samples must be stored and processed. Often the interval for processing the samples is limited by the occurrence of the next event and its corresponding sampling activity. Thus, there are trade-offs between and among the sampling rate, the duration of the sampling window, the speed of the A-to-D conversion, the frequency of occurrence of the sampling window, the amount of data that can be collected and the amount of digitized data that can be passed on for downstream processing. If the duration of the sampling window is short, then the window on the event observed is narrow. Thus, when a high sampling rate is required, a shortening of the sampling window can help limit the downstream data processing but may also mean that less than adequate observations are made. Designs achieving increases in speed or amount of data collected almost always involve cost increases or power demands that limit applications for the design.

It is unusual to capture long waveforms using a high sampling rate. Those who do it use relatively expensive components. In the fluorescence situation, the most expensive elements are the light source (usually a laser) and the digitizer, usually a digital storage oscilloscope. The relatively high cost has limited the use of such equipment.

It would be desirable to develop a system and method for capturing analog samples of data signals that could provide a high rate of sampling and efficient delivery of digital data derived from the captured samples. Other desirable features are a high degree of accuracy and lower cost than conventional devices.

BRIEF SUMMARY OF THE INVENTION

The subject invention, in one embodiment, is an apparatus for capturing and digitizing at least one analog signal derived from an event with a signal duration that is short compared to the interval between consecutive analog signals comprising:

two or more memories each capable of storing a sequence of analog samples of one of two or more analog signals derived from the event;

a trigger for triggering the sampling and storage in the two or more memories of a sequence of analog samples to occur at a 0.5 gigahertz or higher rate;

means communicating with the memories for selectively initiating the read out of the analog samples in memories;

an analog to digital converter for receiving each analog sample read out from each of memories and producing in parallel from the analog samples corresponding digitized sample values;

a digital signal processor for operably controlling parameters of the analog to digital converter and receiving the digitized sample values; and an output stage under control of the digital signal processor for outputting the digitized sample values, such that the receiving and conversion and the output of digitized sample values is completed during the interval between consecutive analog signals.

Another embodiment of the subject invention is a method as performed by the preceding apparatus.

While multiple embodiments are disclosed, still other embodiments of the subject invention will become apparent to those skilled in the art from the following detailed description. As will be apparent, the invention is capable of modifications in various obvious aspects, all without departing from the spirit and scope of the subject invention. Accordingly, the drawings and detailed description are to be regarded as illustrative in nature and not restrictive.

DETAILED DESCRIPTION

Background and Overview

Figure 1:
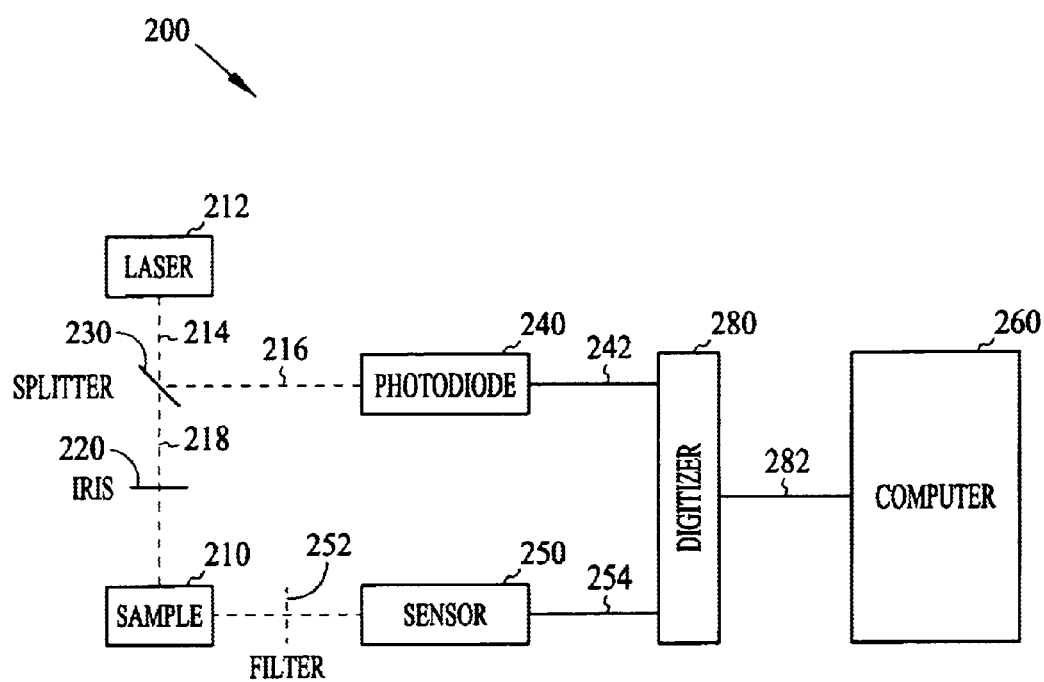
FIG. 1 is a schematic block diagram of a prior art system in which fluorescence decay waveform data is captured and digitized.

As best seen in FIG. 1, a prior art system 200 for capturing a fluorescence decay curve from a sample 210 comprises a laser 212 producing short pulses of laser light 214 that is aimed at the sample 210 in which fluorescence is to be induced. A splitter 230 causes a first portion 216 of the light 214 to be diverted to a photodiode 240. The signal produced by the photodiode 240 is communicated on line 242 to a digitizer 280, which may use the signal to start the sampling operation. The second portion 218 of the light 214 passes through the splitter and reaches the target sample 210 where it causes a fluorescence event in the known manner. An iris 220 can be used to control the light from the laser 212. Light from the fluorescence event is emitted in the direction of an analog output sensor 250, which may be responsive only to a certain wavelength or polarization, with the help of a filter 252 that selects that wavelength or polarization. The analog signal produced by the sensor 250 (typically a photodetector) is communicated on line 252 to the digitizer 280. The digitizer stores one or more samples in analog form and then uses an A to D converter to develop the corresponding digital values.

The digital values are then passed over a communication channel 282 to a computer 260 for further processing. For example, various forms of data comparison or data mining may be desired. In a prior art system that attempts to sample at a high rate, such as on the order of $10^9$ samples per second, and to capture a substantial portion of the waveform produced by sensor 250, the digitizer is typically a digital storage oscilloscope and the digitized values are passed to a separate computer in a raw form, because the digitizer provides conversion from analog to digital values but does no significant processing of the converted sample values.

Design of a digitizer can start with any of the components involved in the trade offs. A digital signal processor (DSP) can be useful to perform not only rapid processing of the digitized data that is the result of A to D conversions but also to provide intelligent control over one or more functions or parameters leading to output of the digitized data. In particular, a DSP can be made with CMOS or bi-CMOS technology and capacitor arrays of the kind that have been used to capture analog samples at high sampling rates can also be realized in CMOS or bi-CMOS. Thus, with CMOS or bi-CMOS (or any other chip-making methodology that permits realization of the essential components on a common substrate), it becomes possible to design a chip in which the DSP and the analog sample storage might be closely coordinated.

As used herein, DSP means any one of the conventional digital signal processor designs that has sufficient speed to handle the volume of data produced from A to D conversion within the time frames discussed further below. A DSP is typically characterized by optimization for numerical and vector processing, typically accomplished in part by having separate memories for data and for instructions. An example of a design of a commercially available DSP that is suitable for adoption in the present invention is the TMS320 family from Texas Instruments Incorporated. Specifically, a design such as the TMS320LF2812, might be adopted and adapted to eliminate the external bus, as part of integrating A to D conversion circuitry with the DSP. While only one DSP is depicted in the embodiments below, where greater processing power is needed, more than one could be used.

Figure 2:
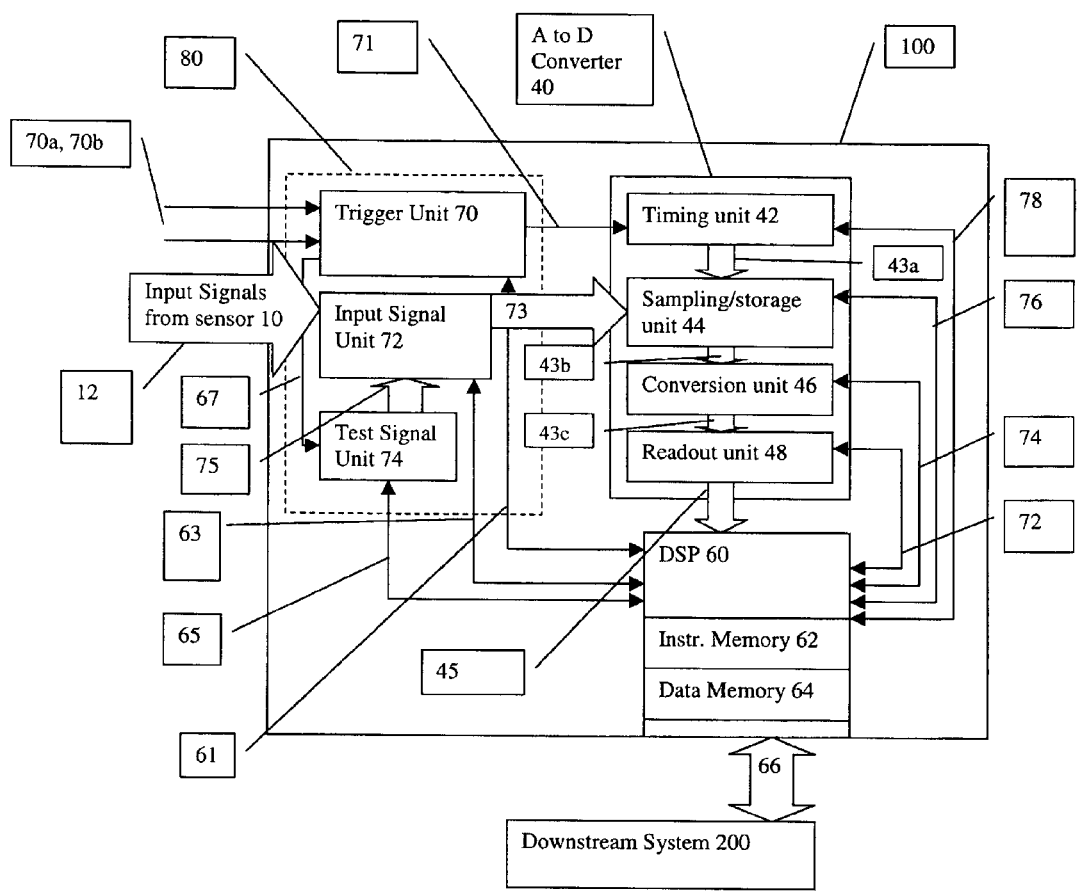
FIG. 2 is a block diagram of the architecture for a digitizer with analog memory and a DSP in accordance with one embodiment.

FIG. 2 shows the architecture of one embodiment of an integrated digitizer-DSP system 100 in accordance with the present invention that replaces the prior art digitizer 280 (FIG. 1) and, potentially, some of the functions of the computer 260. As seen in FIG. 2, the system has a DSP 60 with a separate data memory 62 and instruction memory 64 for control software and other software executed by the DSP. Output from the DSP 60 and from the system 100 occurs over a data link 66 to downstream system 200. Data link 66 may be a serial port to help keep the pin count for the output port low or, for some applications, may be a parallel port of the conventional kind.

A to D converter (ADC) 40 provides to the DSP on bus 45 the digital data that results from conversion of the analog inputs by ADC 40. The ADC 40 has a timing unit 42 that provides signals over internal bus 43a to a sampling and storage unit 44, which in turn provides the samples as outputs to conversion unit 46 over internal bus 43b. Sampling and storage unit 44 is in one embodiment a switch capacitor array with the capacity to accumulate charge in individual cells, which represent the samples having different analog levels that become digitized. Conversion unit 46 passes the now digitized data to a readout unit 48, using internal bus 43c. The DSP has communication paths 72, 74, 76 and 78 connecting it to the readout unit 48, the conversion unit 46, the sampling and storage unit 44 and the timing unit 42, respectively. Thus, the DSP has means for operably controlling a variety of parameters of operation of the ADC 40.

Also part of the digitizer system 100 are: a trigger unit 70, which receives external triggers from one or more trigger sources, e.g., 70a and 70b, and provides trigger signals over line 71 to timing unit 42; an input signal unit 72 that receives the analog input signals to be sampled from sensor 10, selects and conditions these signals in various ways and passes the resulting signals on to the sampling and storage unit 44 on communication path 73; and a test signal unit 74 that provides test signals to the input signal unit 72 via communication path 75. The DSP has communication paths 61, 63 and 65 connecting it to the trigger unit 71, the input signal unit 72 and the test signal unit 74, respectively, which together form a trigger/input module 80. (In an alternative embodiment the trigger/input module 80 includes only units 71 and 72.) The communication and control relationship of the DSP 60 to the various components is now described.

Trigger Unit 70

The trigger unit 70 is used to initiate the sampling that precedes an A to D conversion. (Although shown as integrated on chip 100, it is also possible for all or portions of trigger unit 70 to be implemented off-chip.) The timing of this sampling can be significant to applications. The trigger unit 70 has a variety of trigger facilities and parameters that are available for DSP control. The DSP 60 can enable or disable triggering, select the trigger source (e.g., select 70a or 70b), set the trigger gain, clear the triggered condition, set the trigger threshold level, and assert a trigger. The DSP can also set the time delay between the arrival of an external trigger and the triggering of the timing unit. Small changes in the delay can be used to implement equivalent time sampling (ETS) of repeatable input signals. Large changes in delay can be used to capture long transients as multiple segments or to move the sampling window to a region of interest. The trigger unit 70 can be held in a "ready" state without dissipating a lot of power (at least compared to a unit that is continuously clocked at a high rate), and it can "wake up" the rest of the system 100 (which could be in a low power state) when a trigger signal arrives.

To calibrate the trigger delay, the DSP 60 configures the trigger and test signal units 70, 74 so that a test signal is generated in response to the trigger signal. The DSP 60 can observe the effects of changes made by the DSP 60 to the trigger delay by inspecting the location of the test signal in the waveform read out from the ADC. Useful settings are saved by the DSP for later use.

Input Signal Unit 72

The input signal unit 72 may have one or more channels on which it receives the analog signals that are to be sampled. (Although shown as integrated on chip 100, it is also possible for all or portions of input signal unit 72 to be implemented off-chip.) The input signal unit 72 also has the ability to condition the incoming analog signals by adjusting the level with an offset, amplification or attenuation. The DSP 60 can select the input source, set offsets in input signal levels, and set gains.

To calibrate the offset, the DSP 60 sets the input signal unit to present a null signal and uses the ADC 40 to measure the result. The DSP can cause the input signal unit to change the offset or save the result and make a digital correction later.

To calibrate the gain, the DSP 60 controls the input signal unit to present DC signals with known levels. The DSP can also cause the test signal unit to generate signals with known amplitudes. The DSP uses the ADC output to observe changes made by the DSP to the gain. Useful gain settings can be saved by the DSP for later use.

If the same signal is available to more than one channel but with different delays, this DSP control provides a way to obtain interleaved samples. If the same signal is available to more than one channel but with different gains, this DSP control provides a way to extend dynamic range, as explained further below.

The DSP 60 may be able to detect an input out-of-range condition, by monitoring the input signal unit 72. If this event causes a condition flag to be set, the DSP 60 can read and clear this flag.

Test Signal Unit 74

Test signals are used to measure the trigger delay and the sampling rate. The signals used for measuring trigger delay are initiated by a signal from the Trigger Unit 70. The DSP 60 can adjust the timing and shape of the test signals. The DSP 60 enables and disables their use. Test Signal Unit 74 is also connected to Trigger Unit 70 via communication link 67. (Although shown as integrated on chip 100, it is also possible for all or portions of test signal unit 74 to be implemented off-chip.)

Timing Unit 42

The timing unit 42 generates the sampling strobes for the ADC 40. The rate at which these are generated is adjustable, which also influences the interval of time during which they are generated (sampling window). The DSP 60 can set the rate at which the strobes are generated and the length of time during which the storage cells track the input signal. The DSP 60 receives a signal from the timing unit 42 indicating when the sampling is done.

More specifically, the amount of time that a sampling capacitor tracks the input signal can be selectable, such as by the DSP 60. For example, it could track for N sampling periods where N is a pre-selected number, such as, 1, 2, 4, 8, or 16. This selection of the number of sampling periods is independent of the sampling rate and the width of the sampling window.

The DSP 60 can calibrate the sampling rate by causing the test signal unit 74 to generate a signal with features that are separated by a known period of time. An example of such a signal would be a clock signal. This signal is digitized by the ADC and the DSP uses the ADC output to determine the current sampling rate. The DSP then increases or decreases the sampling rate accordingly. As an alternative, a delay locked loop could be used to control the sampling rate. The DSP 60 could select the number of clock pulses from a clock and use this to define the width of the sampling window and thereby the sampling rate.

Sampling & Storage Unit 44

The sampling gates are essentially integrated into the storage unit; that is why the two functions, sampling and storage, are pictured as one unit. The DSP 60 can set the reference voltage level for the storage cells. The storage cells are organized as a matrix of capacitors, with multiple channels. The multiple cells in each channel are converted in parallel by presenting them in parallel to the conversion unit 46. The DSP 60 selects the channel to be presented to the conversion unit 46. There is a bank of buffers (not shown) between the storage cells and the A/D converters. These buffers are in one embodiment considered part of the sampling and storage unit 44. The DSP 60 can set the reference voltage level for these buffers. The DSP 60 can be programmed to set the voltage to which the capacitor cells are to be initialized or not to initialize the capacitors. In the latter case, the capacitors are "initialized" to their values from the previous sampling operation (subject to any leakage of charge during the interval between sampling operations).

Conversion Unit 46

The conversion unit uses a ramped reference voltage or an adjustable DC threshold to perform the determination of the analog level present in a cell. The DSP 60 can set the comparator reference voltage level, reset the ramp, start the ramp, control the ramp speed, start the counter for counting levels, advance the counter, set the range over which the counter will count, and reset the counter. The conversion unit 46 can send and the DSP 60 can receive a signal indicating that all the comparators have fired and/or a separate signal indicating that at least one comparator has fired. The DSP 60 can select between the ramp and the adjustable DC threshold. The DSP 60 can force the latches in the readout unit 48 to be loaded with the current counter output.

The DSP can measure and set (and thereby calibrate) the ramp speed by causing the input signal unit to present various DC levels to the ADC. The differences between the outputs of the ADC for the various levels are a measure of the ramp speed. The DSP can increase or decrease the ramp speed accordingly. The DSP may also control the duration of the time interval between the start of the ramp and the start of the counter.

Readout Unit 48

The readout unit 48 holds the digitized data in either serial or randomly addressable form in readiness for the DSP 60. The DSP 60 can shift out or select from this unit the data and permit the data to be driven onto the DSP data bus 66. If there is a known pattern of non-uniformity in the cells that have provided the digitized values, the DSP 60 can use a correction table, formula or other corrective reference and computation to apply corrections to deal with cell-to-cell variations. Cell-to-cell result variations are caused by differences in the circuit elements constituting the sampling cells (the switches and capacitors), the storage unit output buffers, and the comparators in the A/D converters. The DSP can measure these variations by using the output of the ADC when the input is a DC level. The DSP can set the DC level via its connections to the input signal unit. Dependence on various properties of the input signal (e.g., level and rate of change) can be measured by generating signals with the desired properties, which may involve coordination with the test signal unit. The results of these measurements are used by the DSP to apply corrections to acquired waveforms.

Output Port 66

The DSP 60 can communicate (exchange data with) an external device, such as a PC, using output port 66. Depending on the number of samples taken and any preprocessing that can be done by the DSP 60, the size of the sample record to be delivered from a digitizer chip 100 can vary. The digitizer becomes a more effective part of an overall digital sampling solution, to the extent it is programmed with instructions for preprocessing that remove unnecessary data or otherwise optimize the size of the sample record.

Power Levels

In many applications, power consumption is a significant variable, due to thermal considerations, limitations on available power, etc. The DSP 60 can use communication links to various elements in system 100 with which the DSP has communication, including those in the ADC 40 or within the DSP 60 itself, to reduce power usage by idling circuits within the system 100, reducing the frequency of their use, or using low power operational modes. Power conservation features can be of two types, depending on whether or not they prevent the digitizer from being able to respond to a trigger event; the latter enabling greater conservation but placing the digitizer in an inactive mode.

Figure 3:
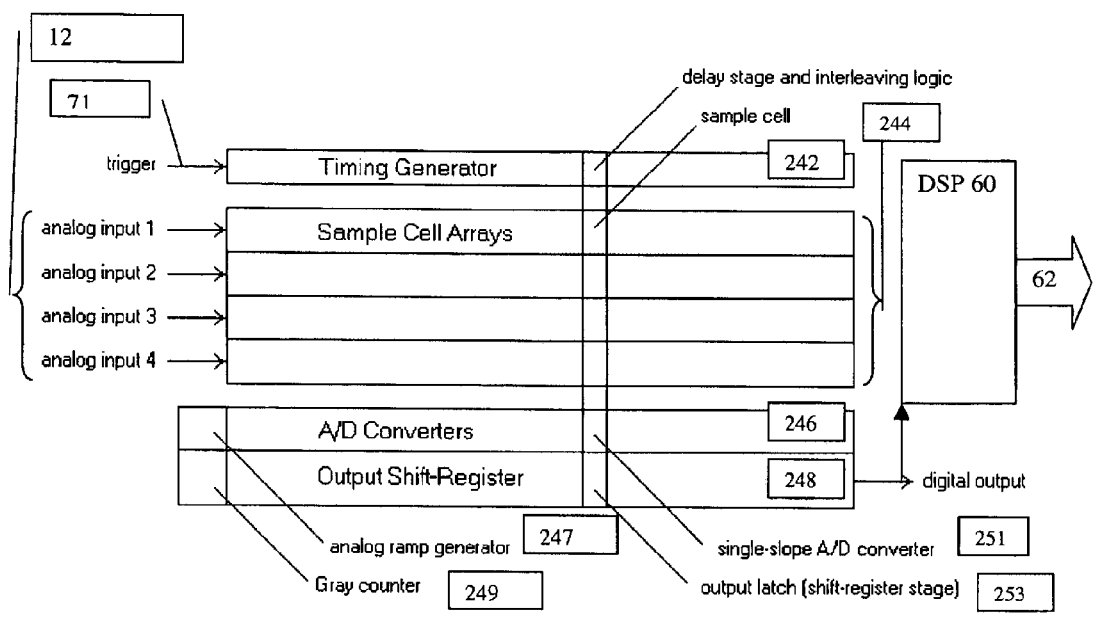
FIG. 3 is a schematic diagram of the sample signal capture and data flow in a system according to one embodiment.

Turning now to FIG. 3, further details of the ADC 40 and its linkage to DSP 60 are discussed. The structure of portions of the ADC 40 is based on the analog transient waveform digitizer described in B. Greiman, et al., "Digital Optical Module & System Design for Km-Scale Neutrino Detector in Ice" Lawrence Berkeley National Laboratory, Jun. 20, 1998.

Timing Generator 242

The trigger signal (from trigger unit 70, see FIG. 2) received by the timing generator 242 initiates a timing signal from the timing generator 242 that propagates through the delay stages and interleaving logic, generating the strobe signals needed to control the sampling operations of the individual sample cells in the sample cell arrays 244. (FIG. 3 shows schematically one strobe path from the timing generator into a "column" in the sample cell arrays.) The sampling speed is determined by the propagation speed, which in turn is controlled by an input current bias. It is useful to note that this sampling speed is not governed by the clock speed of the DSP 60, and can be much faster. In one embodiment, the sampling speed is about 0.5–20 gigahertz, preferably about 1–10 gigahertz.

Another feature of one embodiment of the timing generator appears in the arrangement shown in FIG. 3, which is that the timing for the sampling comes from a "tapped delay line", made from a sequence of delay stages. Sampling begins when a trigger 71 arrives at the timing generator. If the trigger is derived from the transient to be sampled (or whatever caused the transient), then it is synchronized with the transient and, because the triggering starts the sampling, the sampling is also synchronized with the transient. Consequently, if the transient is repeatable, and the system acquires the waveform multiple times, the samples of the different waveforms will all "line up" (in time). Or, if desired, the system can insert a small delay and "shift" the waveforms relative to each other so that a more detailed composite waveform can be constructed by combining multiple shifted waveforms. Most other samplers use a clock to determine when to sample. Sampling begins with the first clock event after the trigger event. The difference between these two events is random and introduces "jitter" into the position (in time) of each waveform. This makes it more difficult to combine waveforms. In the embodiment shown, such combining is facilitated.

Sample Cell Arrays 244

Analog samples of the input signals (from input signal unit 72, see FIG. 2) are held in the sample cells within the sample cell arrays 244. Each row of sample cells is a channel. In one embodiment, the number of sample cells in a row is about 50–2000, preferably about 128 or 1024. In the embodiment shown, during the sampling phase, analog samples of four signals are acquired concurrently and held in the cells of the four channels. (While in the one embodiment shown there are four channels, more or fewer channels, including just a single channel, are also possible.) The analog samples are passed to the A/D converters 246, one full channel at a time, during the conversion phase. One converter corresponds to each "column" in the sample cell arrays. The many columns mean that this is a highly parallel structure and suitable for integration on a chip. As an alternative, each channel has only one associated A/D converter, which operates with sufficient speed that it can perform serial conversion of all the analog samples within the required repetition interval.

A/D Converters 246

All the samples of a single channel are converted, in parallel, from analog to digital form by an array of single-slope A/D converters (one shown at 251). The A/D converters share the outputs from an analog ramp generator 247 and a Gray counter 249. External signals set the ramp speed, start and reset the ramp, and reset and advance the counter. The counter output is latched into individual output latches of a shift register stage 253, as comparators detect the ramp output passing by the voltage levels of the associated sample cells.

Readout Shift-Register 248

During the readout phase, the output latches are in one embodiment configured as a shift register. The latched values appear at the output of the readout-shift register.

Control by DSP

Operation of the ADC 40 and the trigger/input module 80 is variable based on a number of parameters. The DSP 60 gives the flexibility needed to quickly adapt the ADC's operation to various sampling and conversion methods that are found useful during the development of applications for the embodiments shown. The DSP 60 can also flexibly control operation of components of the trigger/input module 80. In either case, control may be based on signals from or states sensed within the ADC 40 and the trigger/input module. The DSP 60 can perform any of the following:

enable and disable triggering, select trigger sources, set the trigger threshold level, set the trigger delay, and generate a trigger signal select input sources and condition the input signals by setting offsets and gains adjust the timing and shape of the test signals and enable/ disable them set sampling and ramp speeds and optimize performance by setting the ADC bias currents and reference voltages sequence the ADC control signals to step it through its sampling, conversion, and readout phases convert and correct the digital data obtained from the ADC Operating the ADC The ADC 40 as shown in the embodiment of FIG. 2 has four channels and three operational phases: sampling, conversion, and readout. Sequencing of the ADC phases and channels is controlled by the DSP 60. The process starts with the sampling phase. Sampling begins when the ADC receives a 'trigger' signal. All four input channels are sampled concurrently. The DSP 60 waits until it sees the 'trigger complete' signal before it begins the conversion phase.

The DSP 60 starts the conversion process by selecting the channel to be converted, starting the analog ramp, and sending a clock signal to the Gray counter. The ramp speed and the counter clock frequency determine the step size. In one embodiment, the steps are of a size to permit 8–12 bits of resolution, preferably 10–12 bits of resolution and most preferably 10 bits. The ramp approach avoids the use of one comparator for each level of resolution, as is the case for "flash" A to D converters.

After conversion, the DSP 60 configures the output latches to form a shift register and reads out the digital values. To convert and read out the other channels, the DSP selects each one in turn and takes the ADC through the conversion and readout phases for the selected channel.

The DSP's ability to select a channel provides a facility for adjusting dynamic range. There are benefits when the amplitude of the input signal, as seen by the ADC 40, "matches" the input range of the ADC. It is a purpose of the input signal unit 72 to adjust the amplitude of the input signal to achieve this match. However, when the amplitude of the input signal is not known in advance (especially if it is a one-time signal), there may be no opportunity to make this adjustment. A solution to this problem is to route the signal to multiple input channels via paths in which there are amplifiers with differing gains. The input signal unit 72 can accomplish this function and generate multiple copies of the input signal, each copy having an amplitude differing from that of the other copies. For example, the copies may differ in scale by factors of 2. The ADC 40 samples all the copies at the same time, storing the analog samples for each copy in a separate array of storage cells. Now, for greatest efficiency, it is advantageous to convert and read out only the copy whose amplitude most closely matches the input range of the ADC.

What is needed, then, is a quick means by which the DSP 60 can identify the best copy without converting and reading out all the copies. One possibility is to check the input signal unit to see which signals (after amplification) exceeded the input range and pick the largest one that did not. The input signal unit 72 could perform this test and set flags for the DSP to sense. If this information is not available from the input signal unit 72, an alternative is to convert the smallest signal first and, based on the measured amplitude, select the best fit from among the remaining copies (if better than the smallest signal).

Another scheme is possible if the conversion unit 46 provides a DSP-readable indicator that at least one of the comparators has fired. In this case the DSP 60 can select a threshold against which the samples are to be compared and then test all the samples of one channel in parallel against this threshold. If at least one of the comparators fires, then the copy is too large. The DSP can use this capability to quickly find the largest copy that is not too large and take it through the conversion and read out processes.

Data Conversion and Correction

The data from the ADC is in a Gray code format. Before the DSP can perform arithmetic operations with this data, it must be converted to binary code format. This conversion can be done by hardware during readout. The DSP can correct for fixed sample-to-sample variations that are seen when a null input signal is digitized. Measurements of these variations, called pedestals, can be stored in the DSP and subtracted from the data after Gray-to-binary conversion. Each channel has its own set of measured pedestals.

Figure 6:
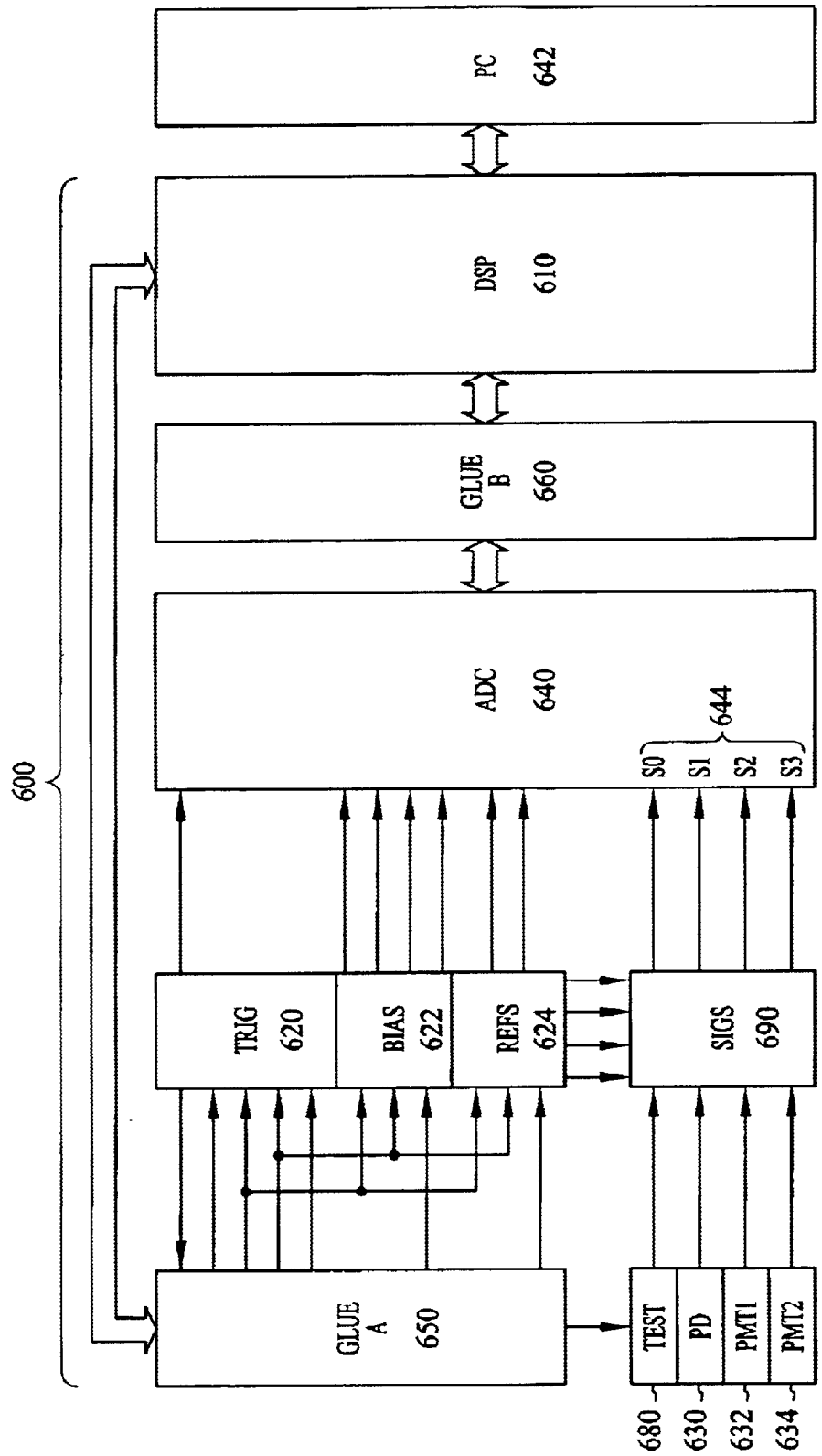
FIG. 6 is a schematic block diagram of another embodiment.

FIG. 6 shows a further embodiment of a digitizer 600 for providing digitized data from an optically detected event to a PC, which is now described. The functions of the embodiment are realized in hardware, software, or a combination of the two. The software components reside in the program storage of the digital signal processor (DSP) 610. The hardware components are pictured in the block diagram of FIG. 6. The ADC 640 and DSP 610 are as described above. The other hardware components in FIG. 6 are described below.

DSP Control of the Trigger, Bias Currents, and Reference Voltages (GLUE A 650): For precise and repeatable control, digital to analog converters (DACs) are built into the TRIG 620, BIAS 622, and REFS 624 components. These DACs control the trigger reference level, the sampling speed and ramp speed bias currents, a number of reference voltages (including the PD 630, PMT1 632, and PMT2 634 signal offsets), and the TEST 680 signal offset. The DACs are programmed by the DSP. Changes may be made from the PC 642 by sending commands to the DSP.

Signal Sources (TEST 680, PD 630, PMT1 632, PMT2 634): The ADC has four input channels (S0–S3) 644. In this example, one channel, the TEST channel, is used for DSP-generated patterns. Another channel, the PD channel, accepts signals from a PIN photodiode. A transimpedance amplifier (TIA) (not shown) may be inserted between the photodiode and the ADC to keep the bias voltage constant, provide some gain, and drive the ADC input. The other two channels, PMT1 and PMT2, accept signals conducted by a 50-ohm coaxial cable. A typical use for one of these channels is to connect to a photomultiplier tube (PMT).

Triggering (TRIG 620): A reverse-biased PIN photodiode is used to detect the laser pulse. A comparator generates the trigger signal when the output of the photodiode exceeds a reference level. The trigger signal must remain active while the ADC is sampling, so a means of latching the signal is needed. The DSP clears the latch when the digitizer is ready to receive the next trigger.

Bias Currents and Reference Voltages (BIAS 622 & REFs 624): There are a number of bias currents and reference voltages that must be set within certain ranges for proper operation of the ADC and the analog input circuitry. Some of these may be variable and others may be set to fixed nominal values. Two useful variable settings are the current biases that control the sampling speed and the ramp speed. These determine the time and amplitude resolutions by which waveforms are sampled and digitized.

Input Signal Conditioning (SIGS 690): The input signals may be AC- or DC-coupled and may have a DC offset added. After this, the TEST, PMT1, and PMT2 channels have an amplifier with a fixed or variable gain. The offsets and gains may be adjustable by the DSP. There may also be input protection circuitry. Out-of-range inputs could be reported to the DSP.

The DSP-ADC Interface (GLUE B 660): The control and status pins of the ADC may be connected to individually programmable digital I/O pins of the DSP. Use is also made of the DSP's data bus. During the readout phase, the digitized data from the ADC is driven onto the bus and loaded into RAM within the DSP. The glue logic includes the tri-state drivers and control logic to perform this read operation.

Timing for Sampling and Digitizing

Figure 4:
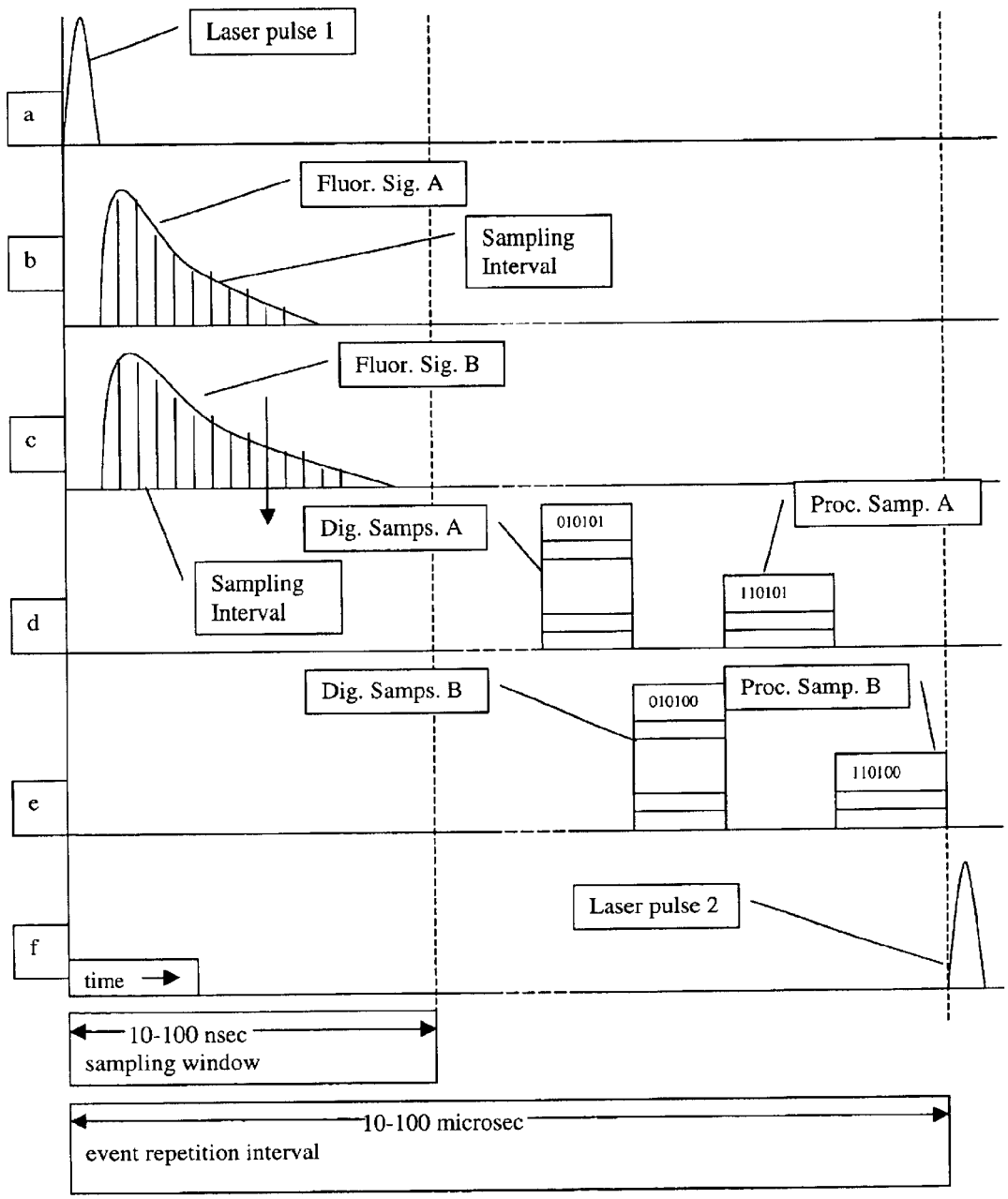
FIG. 4 is a timing diagram showing the relative time scales for sample capture and subsequent signal processing for two fluorescence decay waveforms.

With reference to FIG. 4 the timing of a cycle of sampling and digitizing can be explained, using a laser fluorescence example. A sample is induced to fluoresce by one or more laser pulses. The first pulse is shown at line a of FIG. 4 and the second (next consecutive) pulse is shown at line f. The interval between pulses may be called the repetition frequency interval. The present design contemplates event rates of greater than 10 kiloHz, but remaining significantly (factor of 10 to 100) below the sampling rate. There may be several reasons for using multiple pulses. In some cases, a process, such as a biological process is occurring and it is desired to observe the changes in that process. In other cases, there is such a scarcity of light induced that individual photons or small numbers of photons are observed and it is necessary to have repeated observations in order to build up the points of a waveform representing what is to be observed. In still other cases, the digitizer may be used as part of a piece of equipment that is examining multiple samples, each of which is subjected to one or more laser pulses. The desire to increase throughput requires that laser pulses be spaced with a time interval that minimizes the delay until the next sample.

Each laser pulse will have a relatively short time interval of duration (in the sub-nanosecond, in one embodiment about 0.4, to several nanosecond range) and each corresponding fluorescence waveform will be somewhat longer but also in the several nanosecond range. In order to get a good waveform of the fluorescence emission, it is desirable to take analog samples at a 1 to 4 gigahertz rate. Thus, in one embodiment the sample rate interval for one sample is approximately $1/10^9$ second. The duration of an entire sampling window is on the order of about 10 to 100 nanoseconds. By contrast, the duration of the event repetition interval is about 10 to 100 microseconds. Thus, because sampling occurs at the start of the event repetition interval, almost all of this latter period is available for processing the analog samples, which are collected in the first 10 to 100 nanoseconds. FIG. 4 shows that the Digitized Samples and any Processed Samples appear late in the total interval between laser pulses. (Note that the length of the sampling window and event repetition interval are not shown to scale in FIG. 4; the event repetition interval is much foreshortened and Processed Samples A and B would typically be more staggered in time.)

In FIG. 4, there are two fluorescence signals that are observed following the laser pulse shown on line a. The two waveforms of the two observations appear on lines b and c of FIG. 4. Each analog sample value is depicted by a vertical line under the curve. (There can be one or more of such waveforms, which may be, e.g., observations at different frequencies or have a polarization difference relative to one another. The digitizer as depicted in FIG. 3 is configured to handle up to four waveforms captured during a sampling window.) Once each of the waveforms has been digitized, digital sample values can be stored in digital memory, such as a bank of registers. A sequence of such values is schematically shown as a column of binary numbers labeled "Digitized Samples" at lines d and e of FIG. 4.

DSP 60 may have control software for performing an additional level of processing on the raw digital sample values. Preferably, the processing reduces the size of the data record to be outputted, but it may also add additional measures derived from the raw sample data, such as waveform summing. This will result in another set of data or processed record, shown as a shorter column of binary numbers labeled "Processed Samples" at lines d and e of FIG. 4. DSP processing may reduce record size and alleviate output timing problems from the DSP. Some data calculated by the DSP can be control data, such as "good sample complete" flags to be used as part of a control loop on the chip or including the chip and the outside system, such as a microwell plate reader, or other means by which the digitizer obtains signals corresponding to a different sample. A control loop might be used to move a sample, move a laser-sensor assembly or to change the optical path between the two, as with a movable mirror.

DSP Functions

Placement of the DSP on the chip leads to the usual advantages of speeding inter-component communication, but there are other advantages that arise when DSP-executed functions can occur on chip. A particular benefit is reduced power consumption. This can be particularly useful in applications where a digitizer is needed at a point of signal origination. The present design permits embedding the digitizer/DSP at a point of signal origination, such as a particular location in a transmission network or circuit, even when that point has little power available or limited thermal requirements. This embedded digitizer/DSP also permits real time, digitized data to be generated without bringing in a large piece of equipment. A further benefit of the ADC and DSP integrated on one chip is that while there are internal paths with many lines (particularly where parallelism is used), there are fewer pins or contact points for external signals. This latter also helps reduce overall chip size.

Applications

The ability of the present device to sample waveforms at a high rate and deliver highly precise digital data can, as noted, be used in fluorometers to capture fluorescence decay curves; however it provides benefits to a number of other applications. It may benefit anyone who wants to extract fine features from short pulses at low cost or power. It may especially benefit those who need to monitor changes (seen in the fine features of the samples waveforms) that occur in the millisecond time frame.

Figure 5:
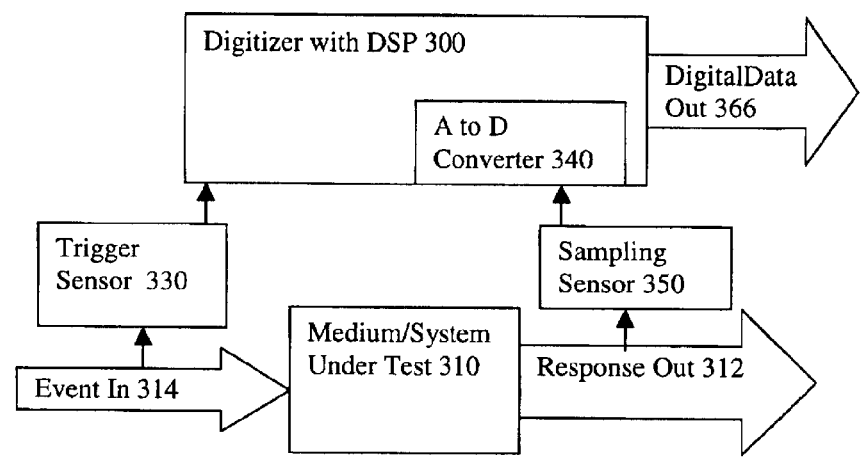
FIG. 5 is a schematic diagram of a signal sampling environment where the signal sampled is not derived from fluorescence but rather from another medium or system under test that causes an input signal passing thorough the system to be transformed into an output signal.

FIG. 5 shows a generalized environment in which the digitizer/DSP embodiments described above may be used to develop digitized data. As seen in FIG. 5, an event 314, such as light or an electrical signal, is applied to a sample, medium or system under test 310. A trigger sensor 330 senses the event and applies a trigger to the digitizer/DSP 300, integrated with A to D converter 340. The response out 312 is produced and sensed by suitable sampling sensor 350. The samples are processed in the digitizer/DSP 300 under control of the DSP to produce digital data out 366, a record of the sampled response out.

Environments where such a digitizer/DSP may be used include, for example:

biological and chemical agent detection;
studies of biochemical kinetics;
calibration of broadband communication channels and adaptive antenna arrays;
Non-destructive evaluation using surface acoustic waves or high resolution ultrasonics;
altimetry, lidar, optical tomography, and mass spectroscopy;
oscillography; and
optical or electrical time domain reflectometry.

The flexibility of the DSP component coordinated with the A to D converter and other components as described in the embodiments above to control the sampling and digitizing process makes it easier to cost-effectively develop a system that collects the desired samples and delivers digitized records containing the desired sampled data in digital form.

Although the subject invention has been described with reference to preferred embodiments, persons skilled in the art will recognize that changes may be made in form and detail without departing from the spirit and scope of the invention.

I claim:

1. An apparatus for capturing and digitizing at least one analog signal derived from an event with a signal duration that is short compared to the interval between consecutive events, comprising:

two or more memories, each capable of storing a sequence of analog samples from one of two or more analog signals derived from the event;

a trigger for triggering the sampling and storage in the two or more memories of a sequence of analog samples to occur at about a 0.5 gigahertz or higher sampling rate;

means communicating with the memories for selectively initiating the read out of the analog samples in the memories;

an analog to digital converter for receiving each analog sample read out from each of memories and producing from the analog samples corresponding digitized sample values;

a digital signal processor for operably controlling parameters of the analog to digital converter and receiving the digitized sample values; and an output stage under control of the digital signal processor for outputting the digitized sample values, such that the receiving and conversion and the output of digitized sample values are completed during the interval between consecutive events.

2. The apparatus of claim 1 wherein the memories, digital signal processor and analog to digital converter are all integrated on one chip.

3. The apparatus of claim 2 wherein the chip is a CMOS or bi-CMOS chip.

4. The apparatus of claim 1 further comprising control software for the digital signal processor to select which memories to read out and in what order.

5. The apparatus of claim 1 further comprising control software for the digital signal processor for pre-processing the digitized sample output values before they are output from the apparatus.

6. The apparatus of claim 1 wherein the digital signal processor operably controls one or more operating parameters of the trigger.

7. The apparatus of claim 1 wherein the digital signal processor operably controls one or more of the following operating parameters of the trigger:

enable/disable trigger, selection of trigger source, setting trigger gain, clearing a triggered condition, setting the trigger threshold level and asserting the trigger action.

8. The apparatus of claim 1 further comprising an input signal unit, wherein the digital signal processor operably controls one or more of the following operating parameters of the input signal unit: adjusting input level with an offset, adjusting input level with gain or attenuation, selecting the input source, setting an offset level, setting a gain or attenuation level.

9. The apparatus of claim 1 further comprising an input signal unit, wherein the digital signal processor calibrates a gain level for the input signal unit.

10. The apparatus of claim 1 further comprising an input signal unit, wherein the digital signal processor calibrates a gain level for the input signal unit by using a test signal unit to generate an input for the input signal unit with a known level.

11. The apparatus of claim 1 further comprising an input signal unit, wherein the input signal unit senses an out of range condition in an input signal and sets a flag accessible to the digital signal processor for reading and clearing.

12. The apparatus of claim 1 further comprising a sampling timing unit wherein the digital signal processor operably controls one or more operating parameters of the sampling timing unit.

13. The apparatus of claim 1 further comprising a sampling timing unit wherein the digital signal processor operably controls one or more of the following operating parameters of the sampling timing unit: a rate of sample strobe generation and duration of the sampling period for one or more analog samples.

14. The apparatus of claim 1 further comprising a sampling timing unit wherein the digital signal processor operably controls one or more operating parameters of the sampling timing unit and calibrates the sampling rate.

15. The apparatus of claim 1 wherein each of the two or more memories comprises a matrix of capacitors defining one or more channels and the digital signal processor operably controls the selection of one or more channels for processing by the analog to digital converter.

16. The apparatus of claim 1 further comprising a conversion unit wherein the digital signal processor operably controls one or more operating parameters of the conversion unit.

17. The apparatus of claim 1 further comprising a conversion unit with a comparator and a voltage reference that can be ramped wherein the digital signal processor operably controls one or more of the following operating parameters of the conversion unit: setting the comparator voltage level, resetting the ramp, starting the ramp, controlling the ramp speed, starting the counter for ramp levels, advancing the counter for ramp levels, setting the range over which the counter will count and resetting the counter.

18. The apparatus of claim 1 further comprising a readout unit in the output stage wherein the digital signal processor operably controls one or more operating parameters of the readout unit.

19. The apparatus of claim 1 further comprising means in the digital signal processor for determining cell-to-cell result variations in sampling cells in the one or more memories, said digital signal processor applying corrections for the cell-to-cell result variations to the digitized sample values before outputting them.

20. The apparatus of claim 1 wherein one or more of the memories, the trigger, the means for communicating with the memories for selectively initiating readout, the analog to digital converter and the digital signal processor have low power modes and the digital signal processor operably controls the initiation and removal of the low power modes.

21. The apparatus of claim 1 further comprising a timing generator for timing sampling and the timing generator is formed by a tapped delay line.

22. The apparatus of claim 1, wherein the analog to digital converter for receiving each analog sample read out from each of the memories is configured with multiple converters to act in parallel on the analog samples in a memory to produce corresponding digitized sample values.

23. The apparatus of claim 1, wherein the analog to digital converter has a conversion unit with a ramped reference value and the digital signal processor calibrates a ramp speed for the converter.

24. A method for capturing and digitizing analog signals derived from an event with a signal duration that is short compared to the interval between consecutive events comprising:
storing at about a 0.5 gigahertz or higher rate in each of two or more memories analog samples of one of two or more analog signals derived from the event;
selectively initiating the read out of the analog samples in memories;
receiving at an analog to digital converter each analog sample read out from at least one of the memories and producing for the analog samples in the at least one memory corresponding digitized sample values;
controlling the parameters of the analog to digital converter by use of a digital signal processor communicating with the analog to digital converter; and
outputting the digitized sample values under control of the digital signal processor, such that the receiving and conversion and the output of digitized sample values is completed during the interval between consecutive events.

25. The method of claim 24 wherein the step of outputting the digitized sample values comprises outputting the digitized sample values from a port of the digital signal processor.

26. The method of claim 24 further comprising testing analog samples in two or more of the memories and based on such testing the digital signal processor selecting which memories the analog to digital converter reads out and in what order.

27. The method of claim 24 further comprising defining an input signal range and comparing the analog samples in each of the one or more memories to the input signal range, wherein the digital signal processor controls the analog to digital converter to convert only the analog samples of the memory whose analog samples most closely match the input signal range.

28. The method of claim 24 further comprising the digital signal processor pre-processing the digitized sample values before these are outputted under control of the digital signal processor.

29. The method of claim 24 further comprising pre-processing the digitized sample values to produce control information derived from the digitized sample values and outputting the control information with the digitized sample values.

30. An apparatus for capturing and digitizing analog samples derived from a waveform representing an event, said waveform having a portion of interest for sampling with a duration that is short compared to the interval between waveforms comprising:
two or more memories each capable of storing analog samples from the waveform, sampled at approximately a 0.5 gigahertz or higher rate, said analog samples characterizing a substantial portion of a decay curve;
a digital signal processor;
control means associated with the digital signal processor for communicating with the memories and for selectively initiating the read out of the analog samples in memories;
an analog to digital converter for receiving analog samples read out from each of the memories and producing for each memory corresponding digitized sample values; and
an output stage under control of the digital signal processor for outputting the digitized sample values, such that the receiving and conversion and the output of digitized sample values is completed during the interval between consecutive signals.

31. The apparatus of claim 30, wherein the analog to digital converter for receiving each analog sample read out from each of the memories is configured with multiple converters to act in parallel on the analog samples in a memory to produce corresponding digitized sample values.

32. An apparatus for capturing and digitizing at least one analog signal derived from an event, the signal duration for sampling being short compared to the interval between consecutive analog signals comprising:
at least one memory capable of storing a sequence of analog samples of the at least one analog signal derived from the event;
a trigger for triggering the sampling and storage in the at least one memory of a sequence of analog samples to occur at about a 0.5 gigahertz or higher rate;
a digital signal processor communicating with the at least one memory for selectively initiating the read out of the analog samples in the at least one memory;
an analog to digital converter for receiving analog samples read out from the at least one memory and producing from the analog samples corresponding digitized sample values;
means at the digital signal processor for receiving the digitized sample values and performing preprocessing to produce a digitized sample record; and
an output stage under control of the digital signal processor for outputting the digitized sample record, such that the receiving and conversion and the output of digitized sample record is completed during the interval between consecutive analog signals.

* * * * *